United States Patent
Molnar et al.

(10) Patent No.: US 7,218,905 B1
(45) Date of Patent: May 15, 2007

(54) GAIN COMPENSATION

(75) Inventors: Alyosha C. Molnar, Costa Mesa, CA (US); Rahul Magoon, Irvine, CA (US); Keith J. Rampmeier, San Diego, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 231 days.

(21) Appl. No.: 10/172,176

(22) Filed: Jun. 14, 2002

(51) Int. Cl.
*H04B 1/06* (2006.01)

(52) U.S. Cl. .............................. 455/240.1; 455/250.1; 375/345

(58) Field of Classification Search ............. 455/232.1, 455/234.1, 240.1, 245.1, 250.1, 230, 234, 455/334, 338, 339, 341; 375/345
See application file for complete search history.

(56) References Cited

U.S. PATENT DOCUMENTS

| | | | | |
|---|---|---|---|---|
| 5,142,695 A | * | 8/1992 | Roberts et al. .............. | 455/437 |
| 6,134,430 A | * | 10/2000 | Younis et al. ................ | 455/340 |
| 6,226,504 B1 | * | 5/2001 | Takagi ...................... | 455/234.1 |
| 6,288,609 B1 | * | 9/2001 | Brueske et al. .............. | 330/129 |
| 6,373,907 B1 | * | 4/2002 | Katsura et al. .............. | 375/345 |
| 6,498,819 B1 | * | 12/2002 | Martin ....................... | 375/345 |
| 6,498,927 B2 | * | 12/2002 | Kang et al. ................. | 455/245.2 |
| 6,721,549 B2 | * | 4/2004 | Lee et al. ................... | 455/234.1 |
| 6,735,422 B1 | * | 5/2004 | Baldwin et al. ............. | 455/232.1 |
| 2003/0078007 A1 | * | 4/2003 | Parssinen et al. ........... | 455/67.1 |
| 2003/0198306 A1 | * | 10/2003 | Forrester .................... | 375/345 |
| 2005/0048938 A1 | * | 3/2005 | Sahota ....................... | 455/127.3 |

* cited by examiner

*Primary Examiner*—Edward F. Urban
*Assistant Examiner*—Nhan T. Le
(74) *Attorney, Agent, or Firm*—Mintz, Levin, Cohn, Ferris, Glovsky and Popeo, P.C.

(57) ABSTRACT

A receiver front end is provided with a low-noise amplifier (LNA), a linearity on demand (LOD) circuit, and a gain calibration device. The LOD circuit provides current to the LNA depending on linearity requirements. The gain calibration device monitors the amount of current provided by the LOD circuit to the LNA and provides signals to help compensate for variations in the LNA's gain due to the variations in the current supplied to the LNA by the LOD circuit. The compensation signals may be used to adjust the gain of a variable-gain amplifier, or may comprise compensation parameters usable by a digital signal processor, to compensate for the gain variations.

29 Claims, 3 Drawing Sheets

GAIN COMPENSATION

BACKGROUND OF THE INVENTION

1. Technical Field

The invention relates to signal processing and more particularly to calibrating gain variations in signal processing of received radio-frequency signals.

2. Background of the Invention

Wireless communications are increasing in popularity and availability every day. More people are using wireless communications and more ways for people to use wireless communications are being made available. For example, cellular telephones are becoming less expensive, smaller, and more widespread. Also, new products such as wireless mice for computers and wireless printers will become common soon. New uses for old products, such as using a cellular phone to purchase products from a vending machine, will also be prevalent before long.

Part of the explosion in wireless communications stems from the portability of devices such as cellular phones. Cellular phones, and many other wireless devices, use battery power. Reducing energy needed from the battery helps allow products to be made smaller, lighter, and more portable, and therefore to be more desirable. Many techniques have been developed to reduce the amount of energy required from a battery, that helps prolong the time between recharges. Sometimes such techniques may affect more than just battery consumption.

SUMMARY

A number of technical advances are achieved in the art by implementation of a gain calibration system for compensating for gain variations in linearity-on-demand (LOD) systems. The gain calibration system may be broadly conceptualized as a system that provides variable gain, or signal processing correction parameters, to help ensure constant overall effective gain; thus allowing a linearity-on-demand system to be used to help reduce energy consumption while guarding against losing or misinterpreting received data.

For example, a gain calibration system that receives radio-frequency signals may utilize a system architecture that applies the relationship between gain of a low-noise amplifier (LNA) and input bias current to the LNA. An implementation of the system architecture may include an LNA, an LOD circuit connected to the LNA and to a gain calibration device, and a variable-gain amplifier (VGA) connected to the output of the LNA and to the calibration device. The LNA receives incoming radio signals and amplifies them using a bias current fed to the LNA from the LOD. The LOD varies the bias current depending on whether there are incoming signals requiring high linearity of the LNA. Variations in the bias current affect the gain of the LNA. The calibration circuit monitors the bias current by receiving an indication of the current from the LOD circuit. In response to the bias-current indication, the calibration circuit sends control signals to the VGA. The VGA receives amplified signals from the LNA and further amplifies these signals based on the control signals from the calibration circuit. The calibration circuit adjusts the gain of the VGA such that the combined gain of the LNA and VGA remains relatively constant.

An implementation of the gain calibration system architecture may also include an LNA, an LOD circuit connected to the LNA and to a gain calibration device, and a digital signal processor (DSP) connected to the output of the LNA and to the calibration device. The LNA amplifies incoming signals depending on a bias current from the LOD circuit and provides the amplified signals to the DSP. The gain calibration device monitors the bias current and provides digital correction parameters to the DSP. The DSP uses the correction parameters to adjust the processing of the amplified signals from the LNA so that the LNA appears to have a relatively constant gain despite the actual gain of the LNA varying with the bias current from the LOD circuit.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principals of the invention. Moreover, in the figures, like reference numerals designate corresponding parts throughout the different views.

Reference will now be made in detail to the description of the invention as illustrated in the figures. While the invention will be described in connection with these figures, there is no intent to limit it to the embodiment or embodiments disclosed in these figures. On the contrary, the intent is to cover all alternatives, modifications, and equivalents included within the spirit and scope of the invention as defined by the appended claims.

DETAILED DESCRIPTION OF PREFERRED EMBODIMENTS

Figure 1:
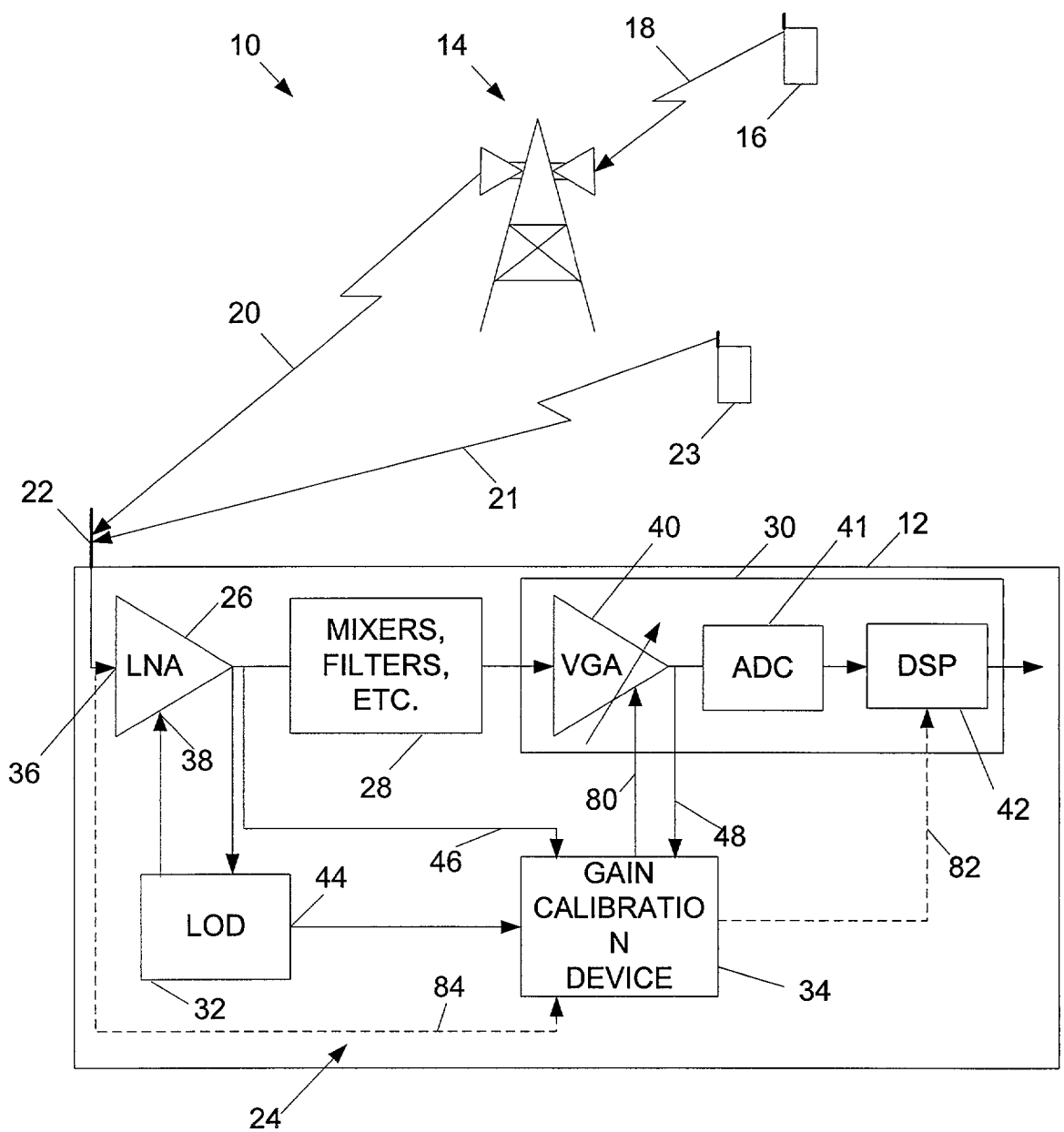
FIG. 1 is schematic diagram of a telecommunications system, including a block diagram of a portion of a receiver of the system.

Referring to FIG. 1, a telecommunications system 10 includes a receiver 12, a relay station 14, and a transmitter 16. The transmitter 16 is configured to send radio-frequency (RF) signals 18 to the relay station 14. The relay station 14 is configured to receive the signals 18 and transmit RF signals 20 with the same information content as the signals 18. Signals 21 may also be sent by a transmitter 23 directly to the receiver 12. The receiver 12 is configured to receive the signals 20 and 21 through an antenna 22. The receiver 12 further includes a front end 24.

The receiver front end 24 is configured for processing the received signals 20 and includes a low-noise amplifier (LNA) 26, a group 28 of mixers and filters, etc., signal processing circuitry 30, a linearity-on-demand (LOD) circuit 32, and a gain calibration device 34. The front end 24 is configured to receive and amplify the signals 20 and 21 while reducing the amount of energy unnecessarily supplied to the LNA 26 compared to other front ends. Signals received by the antenna 22 are transmitted to the front end 24, and in particular to the LNA 26.

The LNA 26 is configured to amplify signals while introducing low amounts of noise to the signals. An RF input 36 of the LNA is configured to receive RF signals. The LNA 26 is configured such that it will amplify the RF signals by different amounts (gains) depending on amounts of bias current supplied by the LOD circuit 32 to a current input 38 of the LNA 26.

The LOD circuit 32 is coupled to the current input 38 and the output of the LNA 26 and is configured to provide current to the LNA 26 depending on signals output by the LNA 26. The LOD circuit 32 is configured to monitor the output of the LNA 26 to determine whether the output signals are indicative of input signals for which high-linearity amplification is desirable, as is often the case for strong input signals. The LOD circuit 32 may provide varying amounts of current to the LNA 26 in response to the determination of desired linearity of the LNA 26. The LOD circuit 32 is configured to provide large amounts of current to the current input 38 if high linearity is desired, and lower amounts of current if lower degrees of linearity are sufficient. The amounts of current may vary continuously with the desired amount of linearity of the LNA 26.

The LNA 26 has linearity characteristics that indicate how uniformly a signal will be amplified by the LNA 26 in response to variable input strength. The linearity characteristics affect performance, e.g., when a weak desired signal is present in conjunction with a strong interferer. Like the LNA's gain, these linearity characteristics also vary depending on the bias current, although not necessarily proportionally to the variance of gain due to bias current changes. The LNA 26 is further configured to output the amplified signals to the group 28 of mixers, filters, etc.

The group 28 of mixers, filters, etc. is configured to receive the amplified signals from the LNA 26 and to process the amplified signals. The group 28 is configured to mix, filter, and further amplify the amplified signals as desired for further processing (e.g., after processing by the front end 24). For example, the group 28 may frequency translate the incoming signals to an intermediate frequency (IF). The group 28 is configured to output the processed amplified signals to the signal processing circuitry 30.

The signal processing circuitry 30 is configured to receive the processed amplified signals from the group 28 and to process these signals as desired. As shown, the processing circuitry 30 includes a variable-gain amplifier (VGA) 40, an analog-to-digital converter (ADC) 41, and a digital signal processor (DSP) 42. The VGA 40 is coupled to the group 28 to receive the signals from the group 28 and is configured to amplify these signals further. The amount of amplification (gain) provided by the VGA 40 varies depending on a control signal (e.g., an amount of current) supplied by the gain calibration device 34 as indicated by arrow 80. Much less current is needed by the VGA 40 compared to the LNA 36 to provide equivalent amounts of gain. The VGA 40 is arranged to output signals to the ADC 41 and in turn to the DSP 42 for further processing. The DSP 42 may be configured to process the signals received from the VGA 40 by programming the DSP 42, e.g., with appropriate software. The DSP may be configured to process signals depending on information received, e.g., from the gain calibration device 34 as indicated by arrow 82. Signals may be output by the DSP 42 for further processing by circuitry not shown in FIG. 1.

Control signals from the gain calibration device 34 affect how the signal processing circuitry 30 processes the signals from the VGA 40. These control signals depend on signals received from the LOD circuit 32. The LOD circuit 32 is configured to provide, on an output 44, a current indication to the device 34 indicating the amount of current supplied to the LNA 26. This current indication may be a portion of the current provided to the LNA 26.

In response to the current indication received from the LOD circuit 32, the gain calibration device may provide a gain indication to the signal processing circuitry 30 indicative of the amount of gain provided by the LNA 26. The gain calibration device 34 is configured to determine the gain provided by the LNA 26 based on one or more relationships between LOD circuit 32 current amounts and corresponding amounts of gain provided by the LNA 26. The device 34 is configured to establish the relationship(s) between LOD circuit 32 current amounts and LNA 26 gain amounts by monitoring the amplified signals directly or indirectly (e.g., after processing by the group 28) output by the LNA 26 and corresponding current indications from the LOD circuit 32. Direct and indirect monitoring is indicated, respectively, by arrows 46 and 48. The gain indication determined from the LOD circuit current and its relationship(s) with LNA gain may be provided to the VGA 40 as indicated by arrow 80, and/or to the DSP 42 as indicated by arrow 82. This gain indication may be usable by the VGA 40 to adjust the gain of the VGA 40 or may be one or more compensation parameters usable by the DSP 42 to compensate for the LNA gain variations when performing its signal processing.

Figure 2:
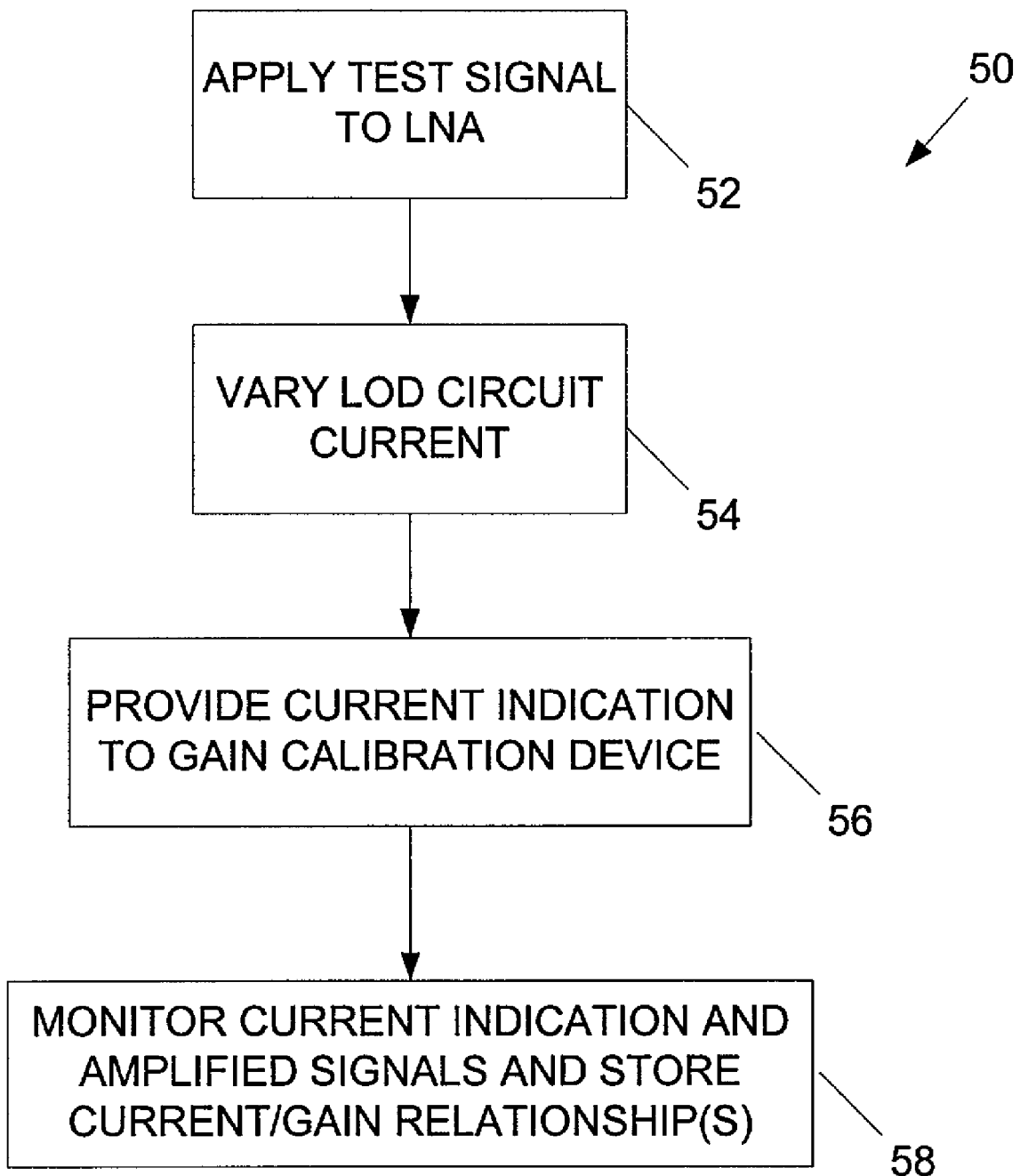
FIG. 2 is a flowchart of a process of relating bias current from a linearity-on-demand circuit shown in FIG. 1 with gain of a low-noise amplifier shown in FIG. 1.
Figure 3:
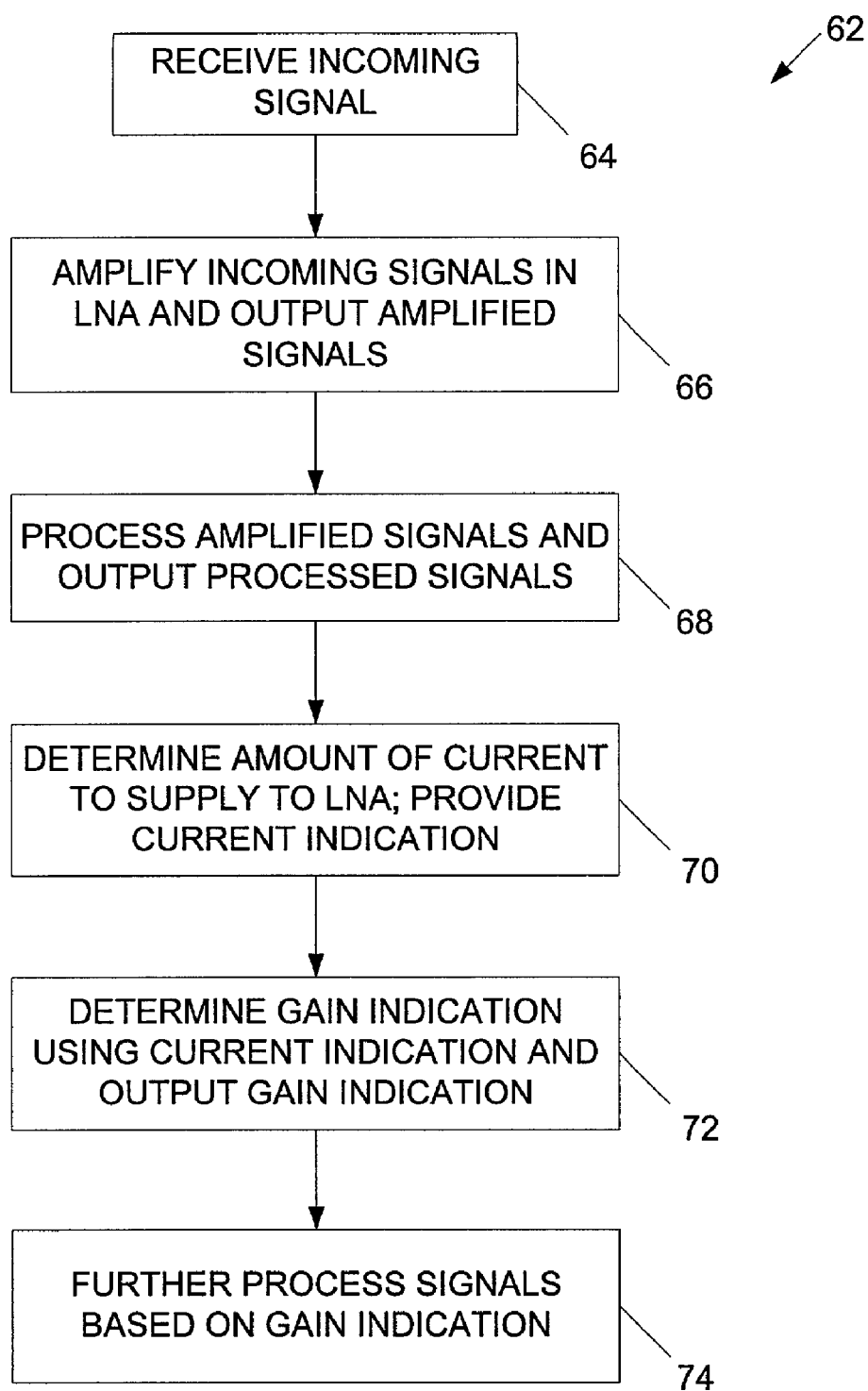
FIG. 3 is a flowchart of a process of receiving and processing signals using the receiver shown in FIG. 1 and the relationship(s) established using the process shown in FIG. 2.

Referring to FIG. 2, a process 50 of relating LOD circuit current amounts and corresponding LNA 26 gain amounts begins at stage 52 with a constant, known test signal being applied to the input 36 of the LNA 26. This signal may be applied directly to the input 36 or through the antenna 22. At stage 54, while the test signal is being applied to the LNA 26, the LOD circuit current supplied to the LNA 26 is varied. At stage 56, the LOD circuit 32 provides current indications to the gain calibration device 34 of the varying amounts of current supplied by the LOD circuit 32 to the LNA 26. At stage 58, the gain calibration device 34 monitors the current indications and the amplified signals (either directly or indirectly from the LNA 26), uses the known magnitude of the input signal, and stores information indicative of the LNA gain given the LOD circuit current. For example, the device 34 may store a look-up table of LOD circuit currents and LNA gains, or a mathematical relationship of LOD circuit current and LNA gain. In operation, the gain calibration device applies the stored relationship(s) between LOD circuit current and LNA gain to adjust the processing of the signal processing circuitry 30. Referring to FIGS. 1 and 3, a process 62 of compensating for varying LNA gain begins at stage 64 with incoming signals being received by the antenna 22. The incoming signals are transmitted to the input 36 of the LNA 26.

At stage 66, the LNA 26 amplifies the incoming signals in accordance with the current supplied by the LOD circuit 32. The LNA 26 uses known techniques to use the current received at the input 38 to amplify the signals received at the input 36, and output the amplified signals.

At stage 68, the amplified signals from the LNA 26 are processed by the group 28 and provided to the signal processing circuitry 30. The group 28 mixes, filters, and further amplifies (and otherwise processes the amplified signals according to the configuration of the group 28) and outputs the processed signals to the signal processing circuitry 30.

At stage 70, the LOD circuit 32 monitors the output of the LNA 26 to determine the amount of current to supply to the LNA 26. The LOD circuit 32 provides amounts of current to the input 38 of the LNA 26 dependent on the strength of signal detected at the output of the LNA 26. For example, if the output of the LNA 26 indicates that a strong signal is being received by the receiver 12, then the LOD circuit 32 provides a relatively large current to the input 38 of the LNA 26. Also at stage 70, the LOD circuit 32 provides the current indication to the device 34 indicating the amount of current presently supplied by the LOD circuit 32 to the LNA 26.

At stage 72, the gain calibration device 34 processes the received current indication from the LOD circuit 32. The device 34 uses the received current indication and the stored information relating the current indication and the gain of the LNA 26 to determine the LNA gain (e.g., the device 34 looks up the current and corresponding LNA gain in a look-up table). Based upon the determined LNA gain, the device 34 determines the gain indication and provides it to the signal processing circuitry 30.

At stage 74, the signal processing circuitry processes the received amplified signals from the group 28. The signals from the group 28 are processed by the circuitry 30 in accordance with the gain indication received from the device 34. This processing may include amplifying the received signals, using the VGA 40, by an amount that depends on the gain indication from the device 34. Alternatively, this processing may include compensating for the LNA gain variations according to one or more compensation parameters indicated by the gain indication. Processed signals are output by the circuitry 30 for further processing in portions of the receiver 12 not shown in FIG. 1.

Other embodiments are within the scope and spirit of the appended claims. For example, the device 34 may be configured to monitor the signal on the input 36 of the LNA 26 as indicated by arrow 84 in FIG. 1. In this case, the monitoring of the input 36 (arrow 84) and the VGA output (arrow 48) essentially provides a gain-control loop. The device 34 may provide the gain indication to the signal processing circuitry 30 without monitoring the LOD circuit current. In operation, the device 34 would monitor the input 36 (arrow 84) and the VGA output (arrow 48), determine gain adjustments based on the monitored signals, and provide corresponding gain indications to the circuitry 30 (arrow 80 or 82).

While various embodiments of the application have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A circuit comprising:
   an input configured to receive radio signals;
   an amplifier coupled to the input and configured to amplify first signals received by the input, an amount of gain provided by the amplifier being dependent on an amount of current provided to the amplifier;
   a current supply coupled to the amplifier and configured to supply varying amounts of current to the amplifier;
   signal processing circuitry coupled to an output of the amplifier for receiving and altering second signals; and
   a controller coupled to the signal processing circuitry, the controller configured and coupled to determine an indication of the gain presently provided by the amplifier and to affect the processing of the second signals by the signal processing circuitry depending on the amount of gain provided by the amplifier, wherein the controller comprises a calibration device configured to provide a control signal, related to the gain of the amplifier, to the signal processing circuitry.

2. The circuit of claim 1 wherein the controller is coupled to the current supply and the controller is configured to affect the signal processing circuitry depending on the amount of current supplied by the current supply to the amplifier.

3. The circuit of claim 2 wherein the amplifier comprises a low-noise amplifier and the current supply comprises a linearity on demand (LOD) circuit.

4. The circuit of claim 2 wherein the amplifier comprises a low-noise amplifier, the signal processing circuitry comprises a variable-gain amplifier, and wherein the controller is configured to provide a gain-control signal to the variable-gain amplifier to adjust the gain of the variable-gain amplifier.

5. The circuit of claim 2 wherein the signal processing circuitry comprises a digital signal processor and the controller is configured to provide correction parameters to the digital signal processor to compensate for variations in gain of the amplifier due to variations in current from the current supply, the correction parameters being dependent on the gain of the amplifier.

6. The circuit of claim 5 wherein the controller is coupled to the current supply and the correction parameters are dependent on the current from the current supply.

7. The circuit of claim 1 wherein the controller is coupled to the signal processing circuitry and the amplifier to provide a gain-control loop, the controller being configured to monitor the first signals and to monitor third signals, that are related to signals output by the amplifier, and to affect the processing of the second signals based on the first and third signals monitored by the controller.

8. The circuit of claim 1 further comprising an intermediate circuit coupled and configured to receive signals output by the amplifier and to provide the second signals to the signal processing circuitry.

9. A wireless-communications device comprising:
   a low-noise amplifier (LNA) coupled to an antenna and configured to amplify radio-frequency signals received by the antenna to provide amplified signals;
   a linearity on demand (LOD) circuit coupled to the LNA and configured to provide varying amounts of current to the LNA, relatively more current when the LNA needs to have relatively high linearity and relatively less current when the LNA can have relatively low linearity, the LOD circuit also configured to provide a current indication indicative of the amount of current supplied by the LOD circuit to the LNA; and
   a calibration circuit coupled to the LOD circuit and configured to provide a gain indication in response to the current indication, the gain indication being indicative of a gain of the LNA.

10. The device of claim 9 further comprising a signal processing circuit coupled to receive signals related to the amplified signals and coupled to the calibration circuit, the signal processing circuit configured to affect the related signals depending on the gain indication.

11. The device of claim 10 wherein the signal processing circuit comprises a variable-gain amplifier (VGA) configured to amplify the related signals by a VGA gain amount that is dependent on the gain indication.

12. The device of claim 10 wherein the signal processing circuit comprises a digital signal processor (DSP), the gain indication comprises compensation parameters, and the DSP is configured to process the signals received by the DSP in accordance with the compensation parameters.

13. The device of claim 9 wherein the calibration circuit is configured to establish a correspondence between the current indication and the gain indication.

14. The device of claim 13 wherein the calibration circuit is configured to monitor the current indication and the amplified signals to establish the correspondence.

15. The device of claim 13 wherein the calibration circuit is configured to provide indicia to the LOD circuit of amounts of current to provide to the LNA and to monitor signals related to the amplified signals in order to establish the correspondence.

16. A method of calibrating gain in a wireless-communications device, the method comprising:
receiving radio-frequency (RF) signals;
supplying the RF signals to a first input of an amplifier and supplying varying amounts of current to a second input of the amplifier;
amplifying the RF signals in the amplifier depending on the varying amounts of current supplied to the second input of the amplifier to provide amplified signals;
determining an indication of an amount of gain presently provided by the amplifier;
providing a control signal, from a calibration circuit, related to the gain of the amplifier; and
adjusting processing of signals related to the amplified signals depending on the gain provided by the amplifier.

17. The method of claim 16 wherein the determining comprises monitoring the varying amounts of current supplied to the second input of the amplifier.

18. The method of claim 17 further comprising providing an indication of the varying amounts of current supplied to the second input of the amplifier and wherein the monitoring comprises monitoring the indication.

19. The method of claim 16 wherein the adjusting comprises:
receiving the signals related to the amplified signals at a variable-gain amplifier; and
altering a gain of the variable-gain amplifier.

20. The method of claim 16 wherein the adjusting comprises:
receiving the signals related to the amplified signals at a digital signal processor;
providing, to the digital signal processor, compensation parameters dependent on the amount of gain provided by the amplifier; and
processing the signals related to the amplified signals with the digital signal processor in accordance with the compensation parameters.

21. A receiver comprising:
an input configured to receive radio signals;
an amplifier coupled to the input and configured to amplify the radio signals received by the input to produce amplified signals, an amount of gain provided by the amplifier being dependent on an amount of current provided to the amplifier;
a linearity-on-demand circuit coupled to the amplifier and configured to supply varying amounts of current to the amplifier depending on linearity characteristics to be provided by the amplifier; and
means, coupled to receive signals related to the amplified signals, for determining an indication of a gain presently provided by the amplifier and for compensating for the varying gain of the amplifier due to the varying current supplied by the linearity-on-demand circuit to the amplifier, the determining means comprising a calibration device configured to provide a control signal, related to the gain of the amplifier, to the compensating means.

22. The receiver of claim 21 wherein the compensating means is configured to processes the signals related to the amplified signals such that the amplified signals are subjected to re-amplification such that a combined gain provided to the radio signals by the amplifier and the re-amplification is substantially constant.

23. A receiver comprising:
an input configured to receive radio signals;
an amplifier coupled to the input and configured to amplify the radio signals received by the input to produce amplified signals, an amount of amplification provided by the amplifier being dependent on an amount of current provided to the amplifier;
a linearity-on-demand circuit coupled to the amplifier and configured to supply varying amounts of current to the amplifier depending on linearity characteristics to be provided by the amplifier; and
means, coupled to receive signals related to the amplified signals, for compensating for the varying gain of the amplifier due to the varying current supplied by the linearity-on-demand circuit to the amplifier;
wherein the compensating means processes the signals related to the amplified signals such that effectively the gain of the amplifier is substantially constant; and
wherein the compensating means comprises a calibration device configured to provide a control signal related to the gain of the amplifier.

24. The receiver of claim 23 wherein the amplifier comprises a low-noise amplifier and the compensating means comprises a variable-gain amplifier.

25. The receiver of claim 24 wherein the variable-gain amplifier having a variable gain is coupled to the calibration device and is responsive to the control signal to adjust the variable gain.

26. The receiver of claim 23 wherein the compensating means comprises a digital signal processor.

27. The receiver of claim 26 wherein the digital signal processor is coupled to the calibration device and the control signal comprises at least one correction parameter, the digital signal processor being configured to use the at least one correction parameter to process signals.

28. The circuit of claim 1 wherein the amplifier comprises a first amplifier, the signal processing circuitry comprises a second amplifier, and wherein the controller is configured to provide a gain-control signal to the second amplifier to adjust the gain of the second amplifier such that a combined gain of the first and second amplifiers is substantially constant.

29. The method of claim 16 wherein the adjusting processing of signals related to the amplified signals comprises re-amplifying the amplified signals to provide re-amplified signals with the re-amplified signals having a gain relative to the received RF signals that is substantially constant for varying amounts of current supplied to the second input of the amplifier.

* * * * *